(12) United States Patent
Itoh

(10) Patent No.: US 12,100,631 B2
(45) Date of Patent: Sep. 24, 2024

(54) SEMICONDUCTOR DEVICE

(71) Applicant: FUJI ELECTRIC CO., LTD., Kawasaki (JP)

(72) Inventor: Taichi Itoh, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 343 days.

(21) Appl. No.: 17/729,831

(22) Filed: Apr. 26, 2022

(65) Prior Publication Data

US 2022/0399241 A1 Dec. 15, 2022

(30) Foreign Application Priority Data

Jun. 11, 2021 (JP) .................................. 2021-098191

(51) Int. Cl.
*H01L 23/31* (2006.01)
*H01L 23/053* (2006.01)
(Continued)

(52) U.S. Cl.
CPC ............ *H01L 23/053* (2013.01); *H01L 25/18* (2013.01); *H01L 23/3121* (2013.01); *H01L 24/48* (2013.01);
(Continued)

(58) Field of Classification Search
CPC ... H01L 23/053; H01L 25/18; H01L 23/3121; H01L 24/48; H01L 24/49; H01L 2224/48137; H01L 2224/48155; H01L 2224/48225; H01L 2224/49111; H01L 2224/49175; H01L 2924/12031; H01L 2924/12032; H01L 2924/13055; H01L 2924/13091; H01L 2224/29111; H01L 2224/29113; H01L 2224/2912; H01L 2224/29147; H01L 23/3735; H01L 23/4334; H01L 24/06; H01L 24/29; H01L 24/32; H01L 24/73; H01L 24/83; H01L 24/92; H01L 2224/05599; H01L 2224/29109; H01L 2224/29118; H01L 2224/29139; H01L 2224/29339; H01L 2224/48091; H01L 2224/83801; H01L 2224/8384; H01L 23/24; H01L 23/562; H01L 25/072; H01L 24/45;
(Continued)

(56) References Cited

FOREIGN PATENT DOCUMENTS

JP    S62-61349 A    3/1987
JP    H09-246430 A   9/1997
(Continued)

*Primary Examiner* — Elias Ullah
(74) *Attorney, Agent, or Firm* — Rabin & Berdo, P.C.

(57) ABSTRACT

A semiconductor device includes first and second conductive parts, a first bonding wire connecting the first and second conductive parts and having a non-flat portion between opposite ends thereof so that a portion between the opposite ends is away from the first and second conductive parts, a case having a housing space to accommodate the first and second conductive parts, including a sidewall having first to fourth lateral faces surrounding the housing space to form a rectangular shape in a plan view, and a cover disposed on the sidewall, a sealing member filling the case to seal the first bonding wire, and a first stress relaxer for relieving a stress in the first bonding wire. The first bonding wire extends from the second lateral face toward the fourth lateral face, and the first stress relaxer is positioned between the first bonding wire and the first lateral face.

20 Claims, 10 Drawing Sheets

(51) Int. Cl.
*H01L 25/18* (2023.01)
*H01L 23/00* (2006.01)

(52) U.S. Cl.
CPC .... *H01L 24/49* (2013.01); *H01L 2224/48137* (2013.01); *H01L 2224/48155* (2013.01); *H01L 2224/48225* (2013.01); *H01L 2224/49111* (2013.01); *H01L 2224/49175* (2013.01); *H01L 2924/12031* (2013.01); *H01L 2924/12032* (2013.01); *H01L 2924/13055* (2013.01); *H01L 2924/13091* (2013.01)

(58) Field of Classification Search
CPC ... H01L 2224/0603; H01L 2224/45015; H01L 2224/45124; H01L 2224/45147; H01L 2224/48097; H01L 2224/48139; H01L 2224/48227; H01L 2224/48472; H01L 2224/4903; H01L 2224/49113; H01L 2224/73265; H01L 2224/83455; H01L 2224/83463; H01L 2224/85455; H01L 2224/85463; H01L 2224/92247; H01L 2924/19107
See application file for complete search history.

(56) References Cited

FOREIGN PATENT DOCUMENTS

| | | |
|---|---|---|
| JP | 2002-246496 A | 8/2002 |
| JP | 2002-299521 A | 10/2002 |

SEMICONDUCTOR DEVICE

CROSS-REFERENCE TO RELATED APPLICATION

This application is based upon and claims the benefit of priority of the prior Japanese Patent Application No. 2021-098191, filed on Jun. 11, 2021, the entire contents of which are incorporated herein by reference.

BACKGROUND OF THE INVENTION

1. Field of the Invention

The embodiments discussed herein relate to a semiconductor device.

2. Background of the Related Art

Semiconductor devices include power devices, and are used as power converters. Examples of such power devices are insulated gate bipolar transistors (IGBTs) and power metal oxide semiconductor field effect transistors (MOS-FETs). The semiconductor devices include insulated circuit boards and semiconductor chips including power devices. The insulated circuit boards include insulating plates and circuit patterns which are formed on the front surfaces of the insulating plates and to which semiconductor chips are bonded. On the insulated circuit boards, bonding wires electrically connect between the semiconductor chips and the circuit patterns as well as between the multiple circuit patterns, to thereby form circuits. Such insulated circuit boards are housed in a case and then a sealing member is injected to fill the inside of the case (see, for example, Japanese Laid-open Patent Publications No. 2002-246496).

In such semiconductor devices, energization control is performed according to control signals for semiconductor chips. When current is applied, the semiconductor chips generate heat, which heats up inside the semiconductor devices. When no current is applied, heat generation of the semiconductor chips is stopped, which then cools the heated interior of the semiconductor devices.

In the semiconductor devices cited above, with repetitive heat generation of the semiconductor chips, the sealing member in the case undergoes repeating cycles of expansion and contraction. Bonding wires encapsulated in such a sealing member are subjected to stress associated with deformation of the sealing member. That is, the bonding wires swing with their bonding points as swing starting points due to expansion and contraction of the sealing member. As the swinging is repeated over long term use of the semiconductor devices, the bonding wires may become deformed and a short circuit may occur as a result of shortened insulation distance with wiring members having different potentials. In addition, the bonding wires may develop metal fatigue near the bonding points and in some cases break off, thus decreasing reliability of the semiconductor devices.

SUMMARY OF THE INVENTION

According to an aspect, there is provided a semiconductor device including a first conductive part having a first front surface, and a second conductive part having a second front surface and being separated from the first conductive part; a first bonding wire having one and the other ends, the one end being connected to the first front surface of the first conductive part and the one end being connected to the second front surface of the second conductive part, the first bonding wire having a non-flat portion between the one and the other ends so that a portion between the one and the other ends is away from the first front surface and the second front surface; a case having a housing space therein that accommodates the first conductive part and the second conductive part, and including a sidewall having a first lateral face, a second lateral face, a third lateral face, and a fourth lateral face, sequentially surrounding the housing space to form a rectangular shape in a plan view of the semiconductor device, and a cover disposed on the sidewall to cover the housing space; a sealing member filling the case to seal the first bonding wire; and a first stress relaxer, wherein: the first conductive part and the second conductive part are positioned closer to the first lateral face than are the other lateral faces in the plan view, the first bonding wire extends from the second lateral face toward the fourth lateral face, and the first stress relaxer is positioned between the first bonding wire and the first lateral face.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Several embodiments will be described below with reference to the accompanying drawings. Note that in the following the terms "front surface" and "top face" refer to an X-Y plane facing upward (the +Z direction) in a semiconductor device of the drawings. Similarly, the term "upper" refers to the upward direction (the +Z direction) of the illustrated semiconductor device. On the other hand, the terms "rear surface" and "bottom face" refer to an X-Y plane facing downward (the −Z direction) in the illustrated semiconductor device. Similarly, the term "lower" refers to the downward direction (the −Z direction) of the illustrated semiconductor device. These terms have the same orientational relationships in other drawings if needed. The terms "front surface", "top face", "upper", "rear surface", "bottom face", "lower", and "lateral face" are simply expedient expressions used to specify relative positional relationships, and are not intended to limit the technical ideas of the embodiments described herein. For example, the terms "upper" and "lower" do not necessarily imply the vertical direction to the ground surface. That is, the "upper" and "lower" directions are not defined in relation to the direction of the gravitational force. In addition, the term "major component" in the following refers to a constituent having a concentration equal to 80 vol % or higher.

(a) First Embodiment

Figure 1:
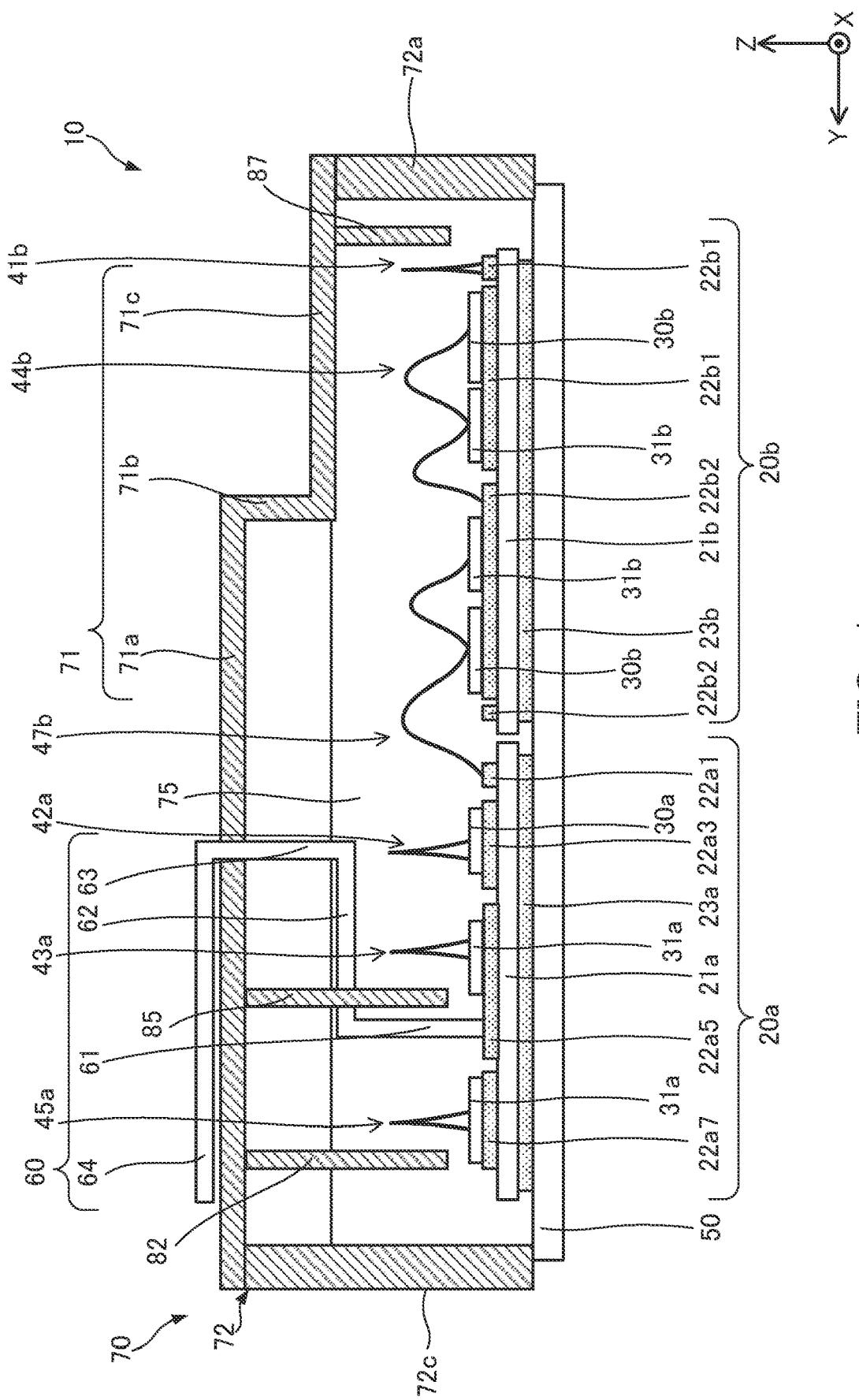
FIG. 1 is a sectional side view of a semiconductor device of a first embodiment.
Figure 2:
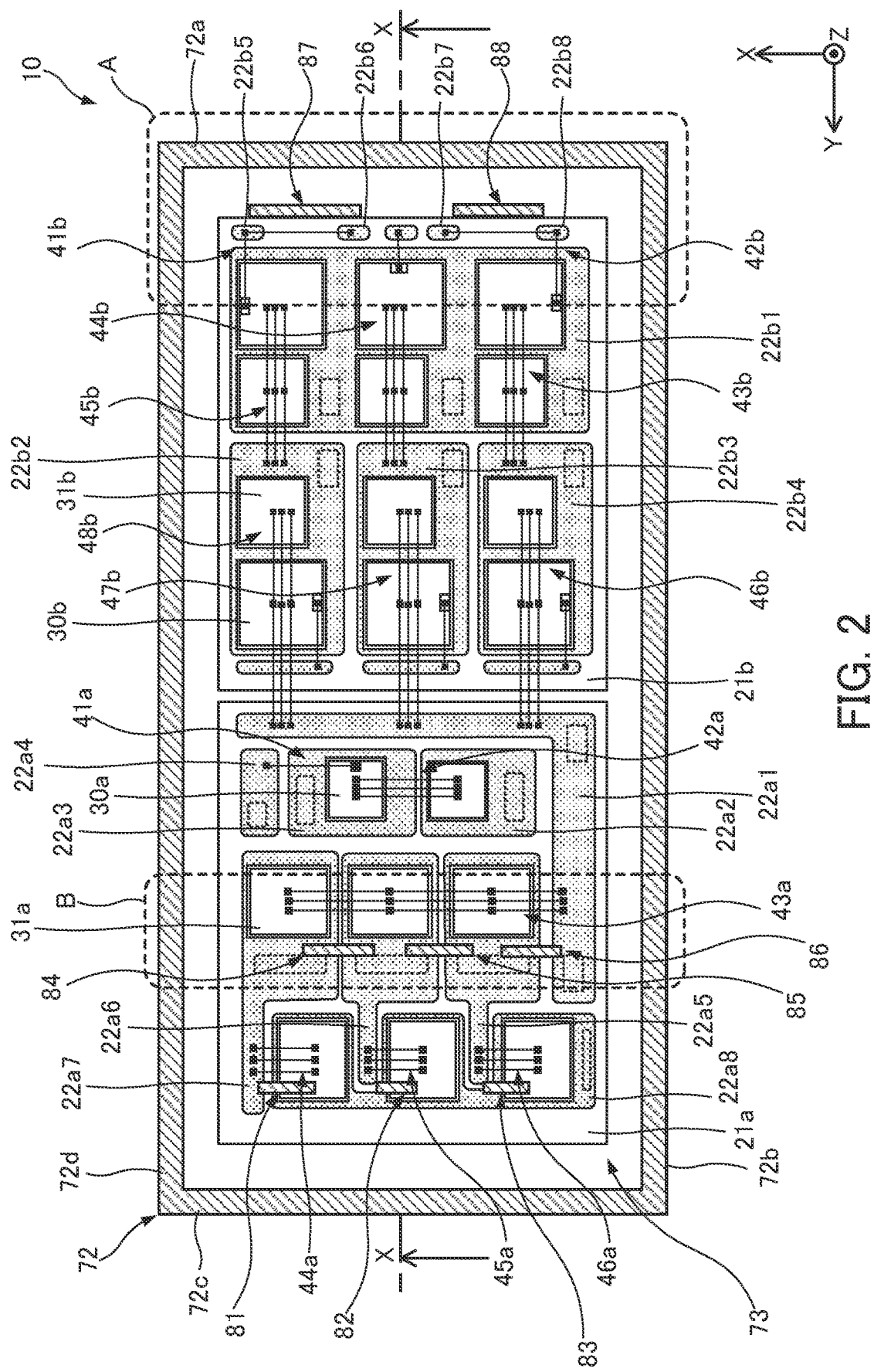
FIG. 2 is a plan view of the semiconductor device of the first embodiment.

Next described is a semiconductor device according to a first embodiment, with reference to FIGS. 1 and 2. FIG. 1 is a sectional side view of the semiconductor device of the first embodiment. FIG. 2 is a plan view of the semiconductor device of the first embodiment. Note that FIG. 1 is a cross-sectional view of the semiconductor device along dashed-dotted line X-X of FIG. 2. The plan view of FIG. 2 corresponds to the sectional side view of FIG. 1, with a cover 71 removed. In addition, external connecting terminals 60 and a sealing member 75 are omitted from FIG. 2. Note that areas delineated by broken lines in FIG. 2 represent installation sites of the external connecting terminals 60.

A semiconductor device 10 includes, as illustrated in FIGS. 1 and 2, insulated circuit boards 20a and 20b and a heat dissipation plate 50 onto which the insulated circuit boards 20a and 20b are soldered (not illustrated). On the insulated circuit boards 20a and 20b, semiconductor chips 30a, 31a, 30b, and 31b are arranged, as depicted in FIG. 2. Bonding wires 41a to 46a and 41b to 48b mechanically and electrically connect between the semiconductor chips 30a, 31a, 30b, and 31b as well as between the semiconductor chips 30a, 31a, 30b, and 31b and the insulated circuit boards 20a and 20b. In the semiconductor device 10, the insulated circuit boards 20a and 20b on the heat dissipation plate 50 are covered with a case 70. The sealing member 75 seals inside the case 70. The semiconductor device 10 also includes the external connecting terminals 60.

The case 70 includes the cover 71 and a sidewall 72. The case 70 is rectangle shaped in a plan view along the Z direction as well as in a lateral view along the Y direction. In a lateral view along the X direction, the case 70 has a stepped L shape such that a part of the top side of the rectangle is sunken.

The sidewall 72 includes first to fourth lateral faces 72a to 72d sequentially surrounding and enclosing a housing space 73 in which the insulated circuit boards 20a and 20b are installed. The first and third lateral faces 72a and 72c correspond to the short sides of the rectangular shape while the second and fourth lateral faces 72b and 72d correspond to the long sides. The height of the third lateral face 72c (in the +Z direction) is greater than that of the first lateral face 72a by the height of a step member 71b. As for each of the second and fourth lateral faces 72b and 72d, a part corresponding to a raised cover member 71a is higher than a part corresponding to a sunken cover member 71c by the height of the step member 71b. The bottom faces of the foregoing first to fourth lateral faces 72a to 72d of the sidewall 72 are bonded to the outer edges of the heat dissipation plate 50 by an adhesive.

The cover 71 is rectangle shaped in a plan view, and closes an opening of the sidewall 72 (to be described later), having a rectangular shape in a plan view. The cover 71 includes the raised cover member 71a, the step member 71b, and the sunken cover member 71c. The raised cover member 71a is rectangle shaped in a plan view, and covers, on the +Y-direction side, two-thirds of the opening of the sidewall 72. The raised cover member 71a is located above the level of the sunken cover member 71c in a lateral view. From the front surface of the raised cover member 71a, external connecting portions 64 of the external connecting terminals 60 are exposed. The sunken cover member 71c is rectangle shaped in a plan view, and covers, on the −Y-direction side, one-third of the opening of the sidewall 72. The step member 71b connects the raised cover member 71a and the sunken cover member 71c. The step member 71b creates a difference in level between the raised cover member 71a and the sunken cover member 71c. The height of the step member 71b (the length in the +Z direction) is set such that the length from the heat dissipation plate 50 to the raised cover member 71a is greater than or equal to 120% of the length from the heat dissipation plate 50 to the sunken cover member 71c but less than or equal to 250%. Note that the above mentioned areas of the raised cover member 71a and the sunken cover member 71c in a plan view are merely examples.

On the rear surfaces of the raised cover member 71a and the sunken cover member 71c of the cover 71, stress relaxers 81 to 86 and stress relaxers 87 and 88, respectively, are provided. The stress relaxers 81 to 86 and stress relaxers 87 and 88 are integrally formed with the rear surfaces of the raised cover member 71a and the sunken cover member 71c of the cover 71, respectively, and are made of the same material as the cover 71. Note that the term "stress relaxers 80" may be used in the following description when no distinction is made among the stress relaxers 81 to 88. The individual stress relaxers 80 include a part laid in a direction from the second lateral face 72b toward the fourth lateral face 72d. That is, the stress relaxers 80 may be arranged along the X direction (i.e., parallel to the first lateral face 72a and the third lateral face 72c) corresponding to the short sides of the semiconductor device 10 in a plan view, or may be arranged in a direction within the range of ±45° from the direction parallel to the first lateral face 72a and the third lateral face 72c. FIG. 2 depicts the case where all the stress relaxers 80 are laid along the X direction (i.e., parallel to the first lateral face 72a and the third lateral face 72c).

The stress relaxers 81 to 88 extend from the rear surfaces of the raised cover member 71a and the sunken cover member 71c toward the heat dissipation plate 50. In addition, the stress relaxers 81 to 83 are provided, in a plan view, between the third lateral face 72c and the bonding wires 44a to 46a, respectively. The stress relaxers 84 to 86 are individually provided, in a plan view, between the bonding wire 43a and the bottom portions 61 of the external connecting terminals 60. The stress relaxers 87 and 88 (first stress relaxer) are provided, in a plan view, between the first lateral face 72a and the bonding wires 41b and 42b (first bonding wire), respectively. The first stress relaxer is provided for relieving a stress in the first bonding wire. Details of the stress relaxers 80 are described later.

The case 70 described above is built by forming the stress relaxers 80 and then integrally molding each of the sidewall 72 and the cover 71 including the external connecting terminal 60, using a thermoplastic resin. As such a thermoplastic resin, any of the following may be used: a poly phenylene sulfide (PPS) resin; a polybutylene terephthalate (PBT) resin; a polybutylene succinate (PBS) resin; a polyamide (PA) resin; and an acrylonitrile butadiene styrene (ABS) resin.

The insulated circuit boards 20a and 20b include insulating plates 21a and 21b; circuit patterns 22a1 to 22a8 and 22b1 to 22b8 placed on the front surfaces of the insulating plates 21a and 21b; and metal plates 23a and 23b placed on the rear surfaces of the insulating plates 21a and 21b. The insulating plates 21a and 21b and the metal plates 23a and 23b are individually rectangle shaped in a plan view. In addition, the insulating plates 21a and 21b and the metal plates 23a and 23b may have R- or C-chamfered corners. In a plan view, the metal plates 23a and 23b are smaller in size than the insulating plates 21a and 21b and positioned inside the insulating plates 21a and 21b. The insulating plates 21a and 21b are made of a material with insulation properties and excellent thermal conductivity. These insulating plates 21a and 21b are made of ceramics or an insulating resin. The ceramics used in this case is, for example, aluminum oxide, aluminum nitride, or silicon nitride. The insulating resin used in this case is, for example, paper phenol substrate, paper epoxy substrate, glass composite substrate, or glass epoxy substrate. The insulating plates 21a and 21b have a thickness in the range of 0.2 mm to 2.5 mm, inclusive.

The circuit patterns 22a1 to 22a8 and 22b1 to 22b8 are electrically conductive parts made of a metal with excellent electrical conductivity. The metal is, for example, copper, aluminum, or an alloy whose major component is at least one of these. The circuit patterns 22a1 to 22a8 and 22b1 to 22b8 have a thickness in the range of 0.1 mm to 2.0 mm, inclusive. In order to provide improved corrosion resistance, plating may be applied to coat the surfaces of the circuit patterns 22a1 to 22a8 and 22b1 to 22b8. In this case, a material used for plating is, for example, nickel, a nickel-phosphorus alloy, or a nickel-boron alloy. Note that the circuit patterns 22a1 to 22a8 and 22b1 to 22b8 depicted in FIG. 2 are merely examples, and appropriate changes may be made to the number of circuit patterns 22a1 to 22a8 and 22b1 to 22b8, their shapes, sizes and so on, as needed basis.

The metal plates 23a and 23b are rectangle shaped as is the case with the insulating plates 21a and 21b, and individually have an area smaller than that of the insulating plates 21a and 21b, respectively, but larger than the region on which the circuit patterns 22a1 to 22a8 and 22b1 to 22b8, respectively, are formed. In addition, the metal plates 23a and 23b may have R- or C-chamfered corners. The metal plates 23a and 23b are smaller in size than the insulating plates 21a and 21b, and formed all over the insulating plates 21a and 21b, except for their edges. The metal plates 23a and 23b are made of a metal with excellent thermal conductivity as a major component. The metal is, for example, copper, aluminum, or an alloy containing at least one of these. The metal plates 23a and 23b have a thickness in the range of 0.1 mm to 2.5 mm, inclusive. In order to provide improved corrosion resistance, plating may be applied to coat the metal plates 23a and 23b. In this case, a material used for plating is, for example, nickel, a nickel-phosphorus alloy, or a nickel-boron alloy.

As the insulated circuit boards 20a and 20b configured as described above, direct copper bonding (DCB) substrates, active metal brazed (AMB) substrates, or resin insulating substrates may be used, for example.

The semiconductor chips 30a, 31a, 30b, and 31b include power device elements made of silicon, silicon carbide, or gallium nitride. The semiconductor chips 30a, 31a, 30b, and 31b have a thickness, for example, in the range of 40 μm to 250 μm, inclusive. The power device elements are switching elements or diode elements. The semiconductor chips 30a and 30b include switching elements. The switching elements are, for example, IGBTs or power MOSFETs. These semiconductor chips 30a and 30b individually include a drain electrode (or collector electrode) on their rear surfaces as a main electrode. The semiconductor chips 30a and 30b also include, on their front surfaces, a gate electrode as a control electrode and a source electrode (or emitter electrode) as a main electrode. That is, the main electrodes and the control electrodes on the front surfaces and the main electrodes on the rear surfaces of the semiconductor chips 30a and 30b are electrically conductive parts.

The semiconductor chips 31a and 31b include diode elements. The diode elements are, for example, free wheeling diodes (FWDs) such as Schottky barrier diodes (SBDs) or P-intrinsic-N (PiN) diodes. The semiconductor chips 31a and 31b individually include a cathode electrode on their rear surfaces as a main electrode and an anode electrode on their front surfaces as a main electrode. That is, the main electrodes on the front and rear surfaces of the semiconductor chips 31a and 31b are electrically conductive parts.

The rear surface of the semiconductor chip 30a is mechanically and electrically bonded onto the circuit pattern 22a3 via a bonding member (not illustrated). The rear surfaces of the semiconductor chips 31a are mechanically and electrically bonded onto the circuit patterns 22a2 and 22a5 to 22a8 via bonding members (not illustrated). The rear surfaces of the semiconductor chips 30b and 31b are mechanically and electrically bonded onto the circuit patterns 22b1 to 22b4 via bonding members (not illustrated).

The bonding members are solder or metal sintered compacts. When solder is used, it is lead-free solder whose major component is an alloy containing at least two selected from, for example, tin, silver, copper, zinc, antimony, indium, and bismuth. Further, the solder may include an additive, such as nickel, germanium, cobalt, and silicon. The inclusion of the additive increases wettability, brightness, and bond strength of the solder, which results in improved reliability. The metal used for the metal sintered compacts is, for example, silver or a silver alloy.

In place of the semiconductor chips 30a, 31a, 30b, and 31b, reverse-conducting IGBTs (RC-IGBTs) which have integrated functions of both an IGBT and FWD may be used. In place of or in conjunction with the semiconductor chips 30a, 31a, 30b, and 31b, for example, lead frames, external connecting terminals (such as pin terminals and contact parts), and electronics parts (such as thermistors and current sensors) may be installed as needed.

The bonding wires 41a to 46a and 41b to 48b are made of a metal with excellent electrical conductivity as a major component. The metal is, for example, aluminum, copper, or an alloy containing at least one of these. Note that the bonding wires 41a, 41b, and 42b for control have a diameter, for example, in the range of 25 μm to 400 μm, inclusive, while the bonding wires 42a to 46a and 43b to 48b for principal current have a diameter, for example, in the range of 250 μm to 600 μm, inclusive.

The bonding wire 41a mechanically and electrically connects the control electrode of the semiconductor chip 30a and the circuit pattern 22a4. The bonding wire 42a mechanically and electrically connects the main electrode of the semiconductor chip 30a and the main electrode of one semiconductor chip 31a. The bonding wire 43a (second bonding wire) mechanically and electrically connects the circuit pattern 22a1 (third conductive part) and the main electrodes (fourth conductive part) of three semiconductor chips 31a. The bonding wire 44a mechanically and electrically connects the circuit pattern 22a7 and the main electrode of one semiconductor chip 31a. The bonding wire 45a mechanically and electrically connects the circuit pattern 22a6 and the main electrode of one semiconductor chip 31a. The bonding wire 46a mechanically and electrically connects the circuit pattern 22a5 and the main electrode of one semiconductor chip 31a. In this connection, the circuit pattern 22a1 is an example of the third conductive part and the main electrodes of the semiconductor chips 31a are an example of the fourth conductive part, but each of the third and fourth conductive parts may be any of the circuit patterns and the main electrodes and control electrodes of the semiconductor chips.

Note that the individual bonding wires 41a to 46a include a part laid in a direction from the second lateral face 72b toward the fourth lateral face 72d. That is, the bonding wires 41a to 46a may be arranged along the X direction (i.e., parallel to the first lateral face 72a and the third lateral face 72c) corresponding to the short sides of the semiconductor device 10 in a plan view, or may be arranged in a direction within the range of ±45° from the direction parallel to the first lateral face 72a and the third lateral face 72c. FIG. 2 depicts the case where all the bonding wires 41a to 46a are laid along the X direction (i.e., parallel to the first lateral face 72a and the third lateral face 72c). In addition, the bonding wires 41a to 46a connect between their connection targets in such a manner as to curve conically to form arcs away from the front surface of the insulated circuit board 20a. However, the bonding wires 41a to 46a are not limited to this case and may instead be inclined away from the front surface of the insulated circuit board 20a, with a level top. For example, the individual bonding wires 41a to 46a may be formed into a trapezoidal shape.

The bonding wire 41b mechanically and electrically connects the control electrode of one semiconductor chip 30b and the circuit patterns 22b5 and 22b6. The bonding wire 42b mechanically and electrically connects the control electrode of one semiconductor chip 30b and the circuit patterns 22b8 and 22b7. The bonding wire 43b mechanically and electrically connects the main electrode of one semiconductor chip 30b, the main electrode of one semiconductor chip 31b, and the circuit pattern 22b4. The bonding wire 44b mechanically and electrically connects the main electrode of one semiconductor chip 30b, the main electrode of one semiconductor chip 31b, and the circuit pattern 22b3. The bonding wire 45b mechanically and electrically connects the main electrode of one semiconductor chip 30b, the main electrode of one semiconductor chip 31b, and the circuit pattern 22b2. The individual bonding wires 46b to 48b mechanically and electrically connect the main electrode of one semiconductor chip 31b, the main electrode of one semiconductor chip 30b, and the circuit pattern 22a1.

Note that the individual bonding wires 41b and 42b include a part laid in a direction from the second lateral face 72b toward the fourth lateral face 72d. That is, the bonding wires 41b and 42b may be arranged along the X direction (i.e., parallel to the first lateral face 72a and the third lateral face 72c) corresponding to the short sides of the semiconductor device 10 in a plan view, or may be arranged in a direction within the range of ±45° from the direction parallel to the first lateral face 72a and the third lateral face 72c. FIG. 2 depicts the case where both the bonding wires 41b and 42b are laid along the X direction (i.e., parallel to the first lateral face 72a and the third lateral face 72c). In addition, the bonding wires 41b to 48b connect between their connection targets in such a manner as to curve conically to form arcs away from the front surface of the insulated circuit board 20b. However, the bonding wires 41b to 42b are not limited to this case and may instead be inclined away from the front surface of the insulated circuit board 20a, with a level top. For example, the individual bonding wires 41b and 42b may be formed into a trapezoidal shape.

The heat dissipation plate 50 is rectangle shaped in a plan view. The heat dissipation plate 50 has an area large enough to house the insulated circuit boards 20a and 20b thereon side by side and also reserve space for mounting the case 70 (to be described later) around its outer edges located outside of the region in which the insulated circuit boards 20a and 20b are positioned. In addition, the heat dissipation plate 50 may have R- or C-chamfered corners. The heat dissipation plate 50 is made of a metal with excellent thermal conductivity as a major component. The metal is, for example, copper, aluminum, or an alloy containing at least one of these. The heat dissipation plate 50 has a thickness in the range of 2.0 mm to 4.5 mm, inclusive. In order to provide improved corrosion resistance, plating may be applied to coat the heat dissipation plate 50. In this case, a material used for plating is, for example, nickel, a nickel-phosphorus alloy, or a nickel-boron alloy.

On the rear surface of the heat dissipation plate 50, a cooling unit may be mounted via a bonding member. As such a cooling unit, a heatsink with multiple fins, or a water cooling system may be used, for example. As with the heat dissipation plate 50, the heatsink is made of a metal with excellent thermal conductivity, such as aluminum, iron, silver, copper, or an alloy containing at least one of these. In order to provide improved corrosion resistance, plating may be applied to coat the heatsink. In this case, a material used for plating is, for example, nickel, a nickel-phosphorus alloy, or a nickel-boron alloy. The multiple fins may be mounted directly on the rear surface of the heat dissipation plate 50.

The bonding member used in this case is, for example, solder, a brazing material, or metal sintered compacts. The solder used is lead-free solder. The lead-free solder contains, as a major component, an alloy containing at least two selected from tin, silver, copper, zinc, antimony, indium, and bismuth, for example. Further, the solder may include an additive, such as nickel, germanium, cobalt, or silicon. The inclusion of the additive increases wettability, brightness, and bond strength of the solder, which results in improved reliability. The brazing material contains, as a major component, at least one selected from an aluminum alloy, a titanium alloy, a magnesium alloy, a zirconium alloy, and a silicon alloy, for example. The heat dissipation plate 50 may be bonded by brazing using such a bonding member. The metal sintered compacts contain, for example, silver or a silver alloy as a major component. Alternatively, the bonding member may be a thermal interface material. The thermal interface material is an adhesive material including, for example, an elastomer sheet, room temperature vulcanization (RTV) rubber, gel, and a phase change material. The installation of the cooling unit via the foregoing brazing material or thermal interface material improves heat dissipation of the semiconductor device 10.

The external connecting terminals 60 are, as described above, bonded to the rectangular regions bounded by the broken lines on the circuit patterns in FIG. 2. The external connecting terminals 60 described here are those bonded to the circuit patterns 22a5, 22a6, and 22a7. Each of the external connecting terminals 60 is a flat plate-like member.

The external connecting terminals 60 have a uniform thickness throughout, for example, in the range of 0.2 mm to 4.0 mm, inclusive.

Each of the external connecting terminals 60 includes a bottom portion 61, a parallel joint portion 62, a perpendicular joint portion 63, and an external connecting portion 64. In the external connecting terminals 60, the bottom portion 61 is connected to the insulated circuit board 20a, and the external connecting portion 64 is connected to an external device. The bottom portion 61 has a flat plate-like shape, and its lower end is bonded to the corresponding circuit pattern by a bonding member and extends in a vertically upward direction (the +Z direction) relative to the front surface of the circuit pattern. The bottom portion 61 may be bonded not by the bonding member but by ultrasonic joining. The bottom portion 61 has a height (in the +Z direction) greater than the height measured from the front surfaces of the circuit patterns 22a5, 22a6, and 22a7 to the highest point in the bonding wire 43a but is positioned at a lower level than the cover 71 to be described later. The width of the bottom portion 61 (in the X direction) is nearly equal to a side of the semiconductor chip 31a.

The parallel joint portion 62 has a flat plate-like shape. A first end of the parallel joint portion 62 is connected to the top end of the bottom portion 61 while a second end thereof extends above the bonding wire 43a toward the first lateral face 72a along the second and fourth lateral faces 72b and 72d (see FIGS. 5 and 6). The second end of the parallel joint portion 62 extends all the way above the bonding wire 42a. The parallel joint portion 62 may have a width (in the X direction) enough to cover the bonding point of the bonding wire 43a to the semiconductor chip 31a and allow sufficient space to provide insulation from the neighboring parallel joint portions 62.

The perpendicular joint portion 63 has a flat plate-like shape. A first end of the perpendicular joint portion 63 is connected to the second end of the parallel joint portion 62 while a second end thereof extends in a vertical direction (i.e., in the +Z direction) relative to the parallel joint portion 62. The second end of the perpendicular joint portion 63 extends such as to project from the cover 71. The width of the perpendicular joint portion 63 (in the X direction) may be approximately the same as that of the parallel joint portion 62.

The external connecting portion 64 has a flat plate-like shape. A first end of the external connecting portion 64 is connected to the second end of the perpendicular joint portion 63, protruding from the cover 71, while a second end thereof extends over the cover 71 toward the third lateral face 72c (in the Y direction). The second end of the external connecting portion 64 extends such as not to stick out beyond the cover 71. The width of the external connecting portion 64 (in the X direction) may be approximately the same as that of the perpendicular joint portion 63 and the parallel joint portion 62.

Figure 3:
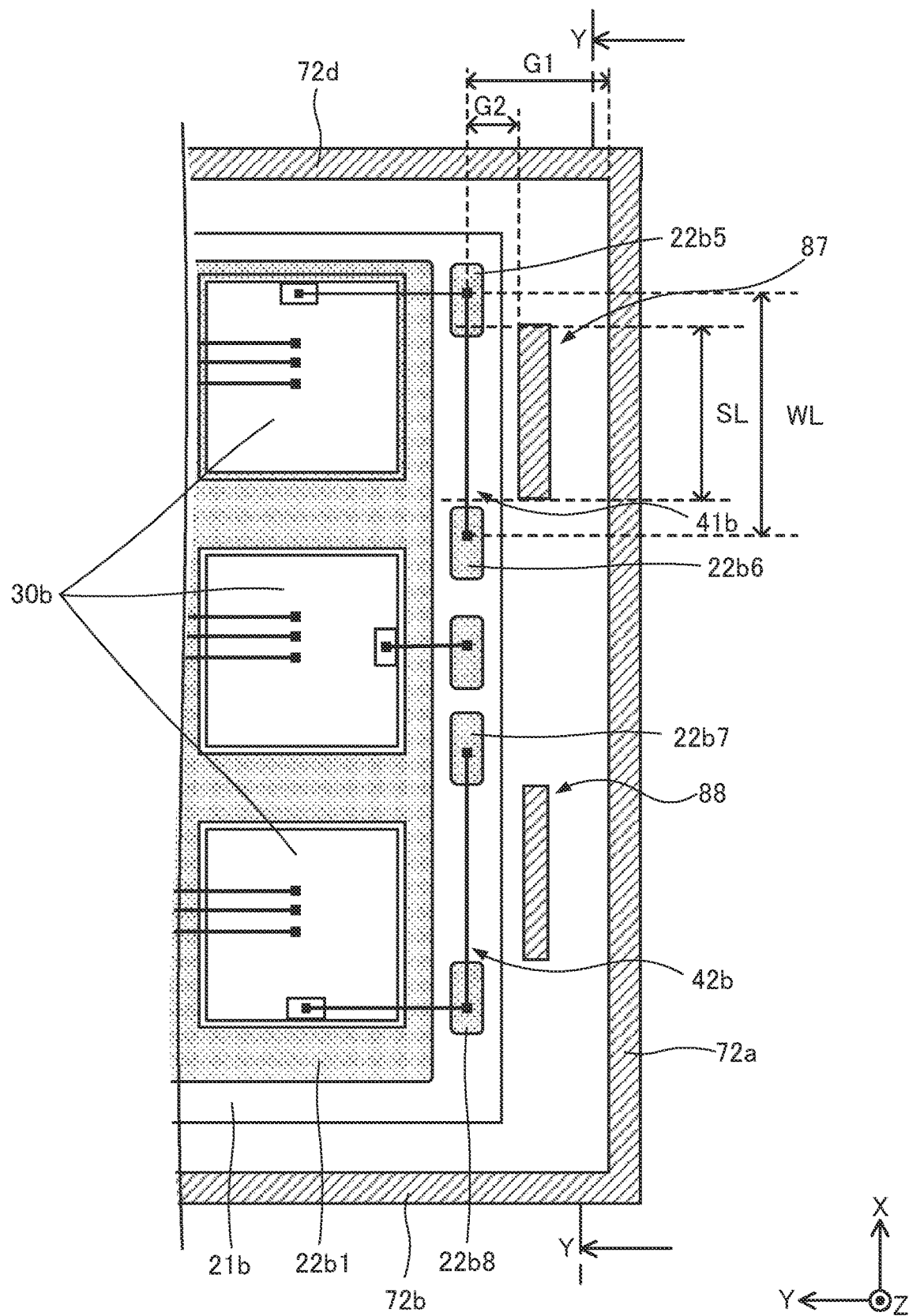
FIG. 3 is a plan view depicting relevant parts on a sidewall-portion side of the semiconductor device according to the first embodiment.
Figure 4:
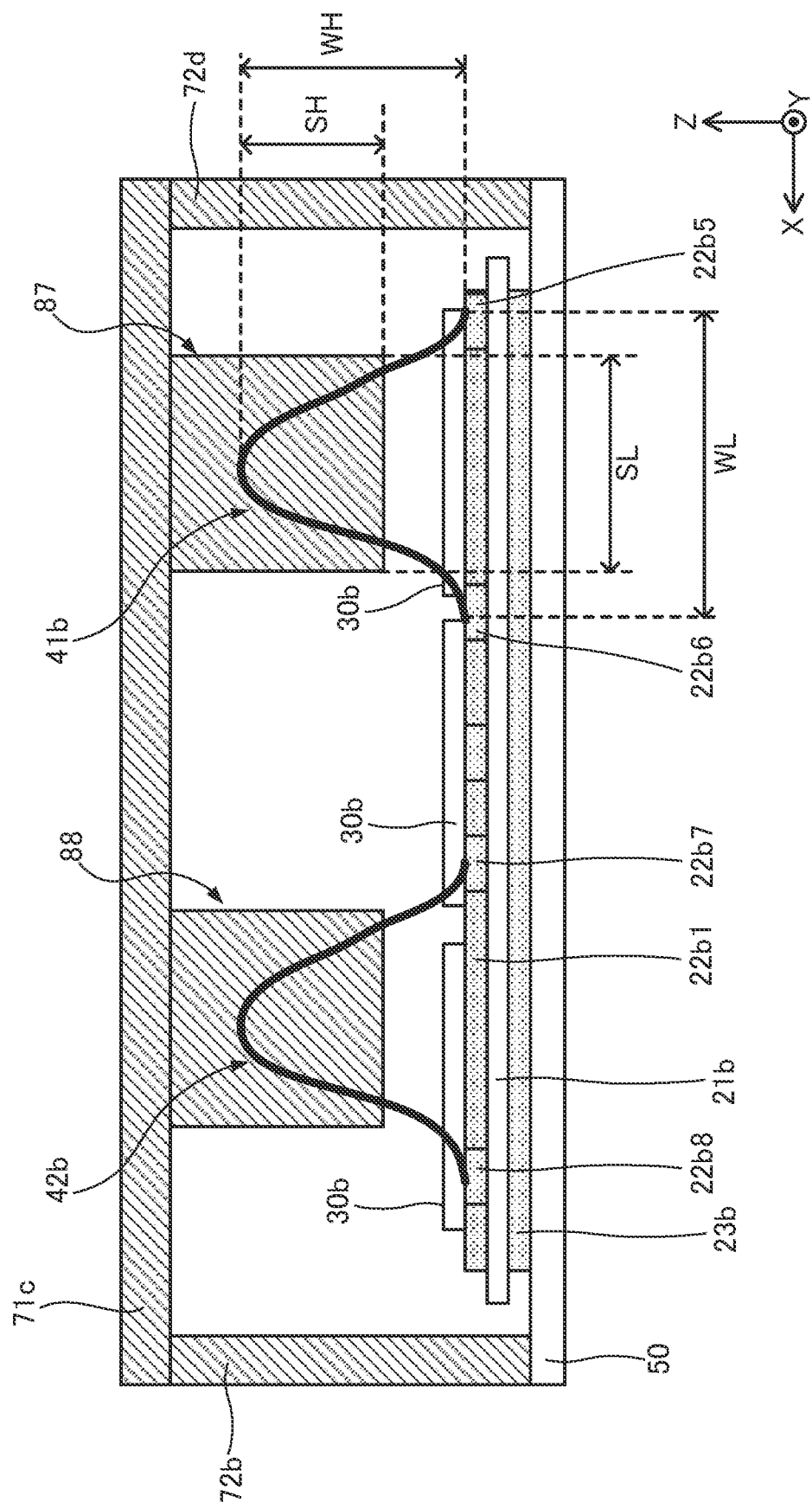
FIG. 4 is a cross-sectional view depicting the relevant parts on the sidewall-portion side of the semiconductor device according to the first embodiment.
Figure 5:
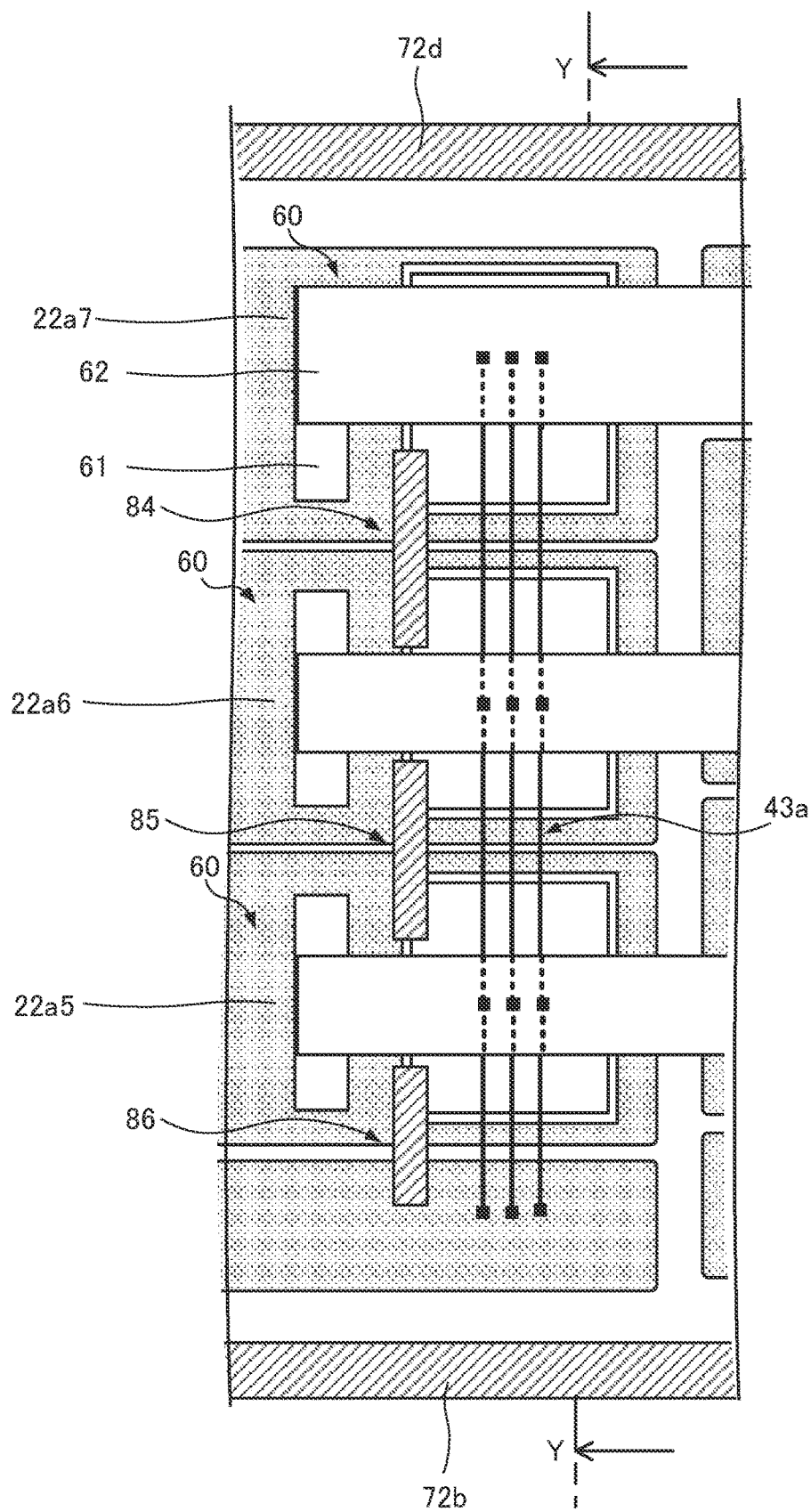
FIG. 5 is a plan view depicting relevant parts on an external-connecting-terminal side of the semiconductor device according to the first embodiment.
Figure 6:
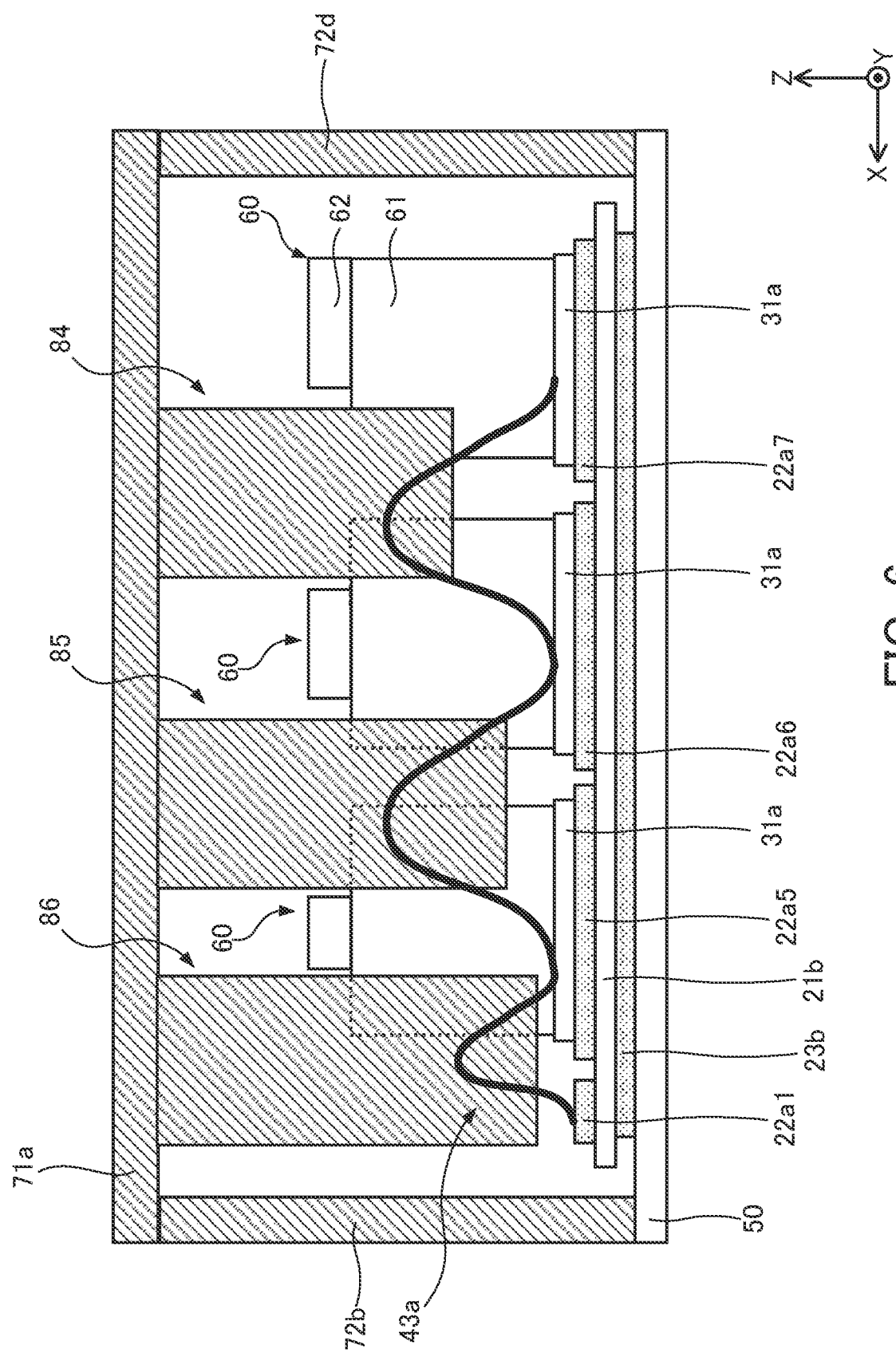
FIG. 6 is a cross-sectional view depicting the relevant parts on the external-connecting-terminal side of the semiconductor device according to the first embodiment.

Next described are details of the stress relaxers 80, with reference to FIGS. 3 to 6. FIG. 3 is a plan view depicting relevant parts on a sidewall-portion side of the semiconductor device according to the first embodiment. FIG. 4 is a cross-sectional view depicting the relevant parts on the sidewall-portion side of the semiconductor device according to the first embodiment. FIG. 5 is a plan view depicting relevant parts on an external-connecting-terminal side of the semiconductor device according to the first embodiment. FIG. 6 is a cross-sectional view depicting the relevant parts on the external-connecting-terminal side of the semiconductor device according to the first embodiment. Note that FIG. 3 is an enlarged view of the inside of a region A delineated by the broken line on the right side of FIG. 2. FIG. 4 is a cross-sectional view of the semiconductor device along dashed-dotted line Y-Y of FIG. 3.

FIG. 5 is an enlarged view of the inside of a region B delineated by the broken line on the left side of FIG. 2. FIG. 6 is a cross-sectional view of the semiconductor device along dashed-dotted line Y-Y of FIG. 5.

The following describes the stress relaxer 87 as an example amongst the stress relaxers 80. The stress relaxer 87 has a flat plate-like shape, and extends from the rear surface of the sunken cover member 71c of the cover 71 toward the heat dissipation plate 50, as described above. The stress relaxer 87 is installed between the bonding wire 41b and the first lateral face 72a. At this time, the stress relaxer 87 is positioned, in a plan view, parallel to the bonding wire 41b laid in the X direction such that a gap G2 is left therebetween in the Y direction. Note also that the bonding wire 41b is laid, in a plan view, with a gap G1 from the first lateral face 72a in the Y direction. The gap G1 may be in the range of 100% to 1000%, inclusive, of a height WH measured from the front surfaces of the circuit patterns 22b5 and 22b6 to the highest point in the peak of the bonding wire 41b (see FIG. 4). On the other hand, the gap G2 may be in the range of 10% to 300%, inclusive, of the peak height WH of the bonding wire 41b.

Alternatively, the gap G2 may be set according to the thickness of the bonding wire 41b although the material of the bonding wire 41b and the bonding strength of the bonding wire 41b to the circuit patterns 22b5 and 22b6 also need to be taken into account. Making the bonding wire 41b thinner allows the gap G2 to be smaller while the bonding wire 41b being thicker allows the gap G2 to be large. For example, the gap G2 may be in the range of 0.5 to 20 times, inclusive, of the thickness of the bonding wire 41b.

A width SL of the stress relaxer 87 (in the X direction) may be, in a plan view, 50% or more of a width WL, which is a connecting interval of the bonding wire 41b that connects between the circuit patterns 22b5 and 22b6. The width SL of the stress relaxer 87 may extend across the space between the second lateral face 72b and the fourth lateral face 72d (that is, the width SL may be equal to the length of the individual first and third lateral faces 72a and 72c). The width SL of the stress relaxer 87 may preferably be in the range of 80% to 120%, inclusive, of the width WL, which is the connecting interval of the bonding wire 41b. In addition, the center of the stress relaxer 87 preferably oppose that of the bonding wire 41b in a plan view. Note that the stress relaxer 87 needs to be thick enough only to maintain the strength allowing it not to be removed from the rear surface of the sunken cover member 71c of the cover 71 under impact and stress from outside or the like.

The stress relaxer 87 need only have an overlap with at least the highest point of the bonding wire 41b in a lateral view seen from the Y direction. In addition, the stress relaxer 87 may extend, from the rear surface of the sunken cover member 71c of the cover 71 toward the heat dissipation plate 50, up to a height SH measured from the highest point of the bonding wire 41b. The height SH is preferably one third of the height WH or greater, and more preferably one half of the height WH or greater. Note that FIG. 4 depicts the case where the height SH is about two thirds of the height WH. In addition, there may be space below the lower end of the stress relaxer 87.

The bonding wire 41b also includes a part laid in a direction from the second lateral face 72b toward the fourth lateral face 72d. The stress relaxer 87 may be parallel to this part of the bonding wire 41b, or may be arranged in a direction within the range of ±45° from the direction parallel to the part of the bonding wire 41b. FIG. 3 depicts the case where the stress relaxer 87 is arranged along (i.e., parallel to) the part of the bonding wire 41b laid in the X direction (i.e., in a direction from the second lateral face 72b toward the fourth lateral face 72d).

Note that, as in the case of the above-described stress relaxer 87, the stress relaxers 81 to 83 and 88 may also be installed relative to the bonding wires 44a to 46a and 42b and the third lateral face 72c and the first lateral face 72a.

The following describes, amongst the stress relaxers 80, the stress relaxers 84, 85, and 86 (second stress relaxer) as examples. The stress relaxers 84, 85, and individually have a flat plate-like shape, and extends from the rear surface of the raised cover member 71a of the cover 71 toward the heat dissipation plate 50, as described above. The stress relaxers 84, 85, and 86 extend, in a lateral view, between the parallel joint portions 62 of the external connecting terminals 60 toward the heat dissipation plate 50. The stress relaxers 84, 85, and 86 are positioned, in a plan view, between the bonding wire 43a (second bonding wire) and the bottom portions 61 of the external connecting terminals 60. At this time, the stress relaxers 84, 85, and 86 are positioned, in a plan view, parallel to the bonding wire 43a laid in the X direction such that the gap G2 (not illustrated) is left therebetween in the Y direction. The gap G1 in this case may also be in the range of 100% to 1000%, inclusive, of the height WH (not illustrated) measured from the front surfaces of the circuit patterns 22a5 to 22a7 to the highest point in the peak of the bonding wire 43a. On the other hand, the gap G2 may be in the range of 10% to 300%, inclusive, of the peak height WH of the bonding wire 43a. The second stress relaxer is provided for relieving a stress in the second bonding wire.

Alternatively, the gap G2 in this case may also be set according to the thickness of the bonding wire 43a although the material of the bonding wire 43a and the bonding strength of the bonding wire 43a to the circuit patterns need to be taken into account. The gap G2 may be set large. For example, the gap G2 may be in the range of 0.5 to 20 times, inclusive, of the thickness of the bonding wire 43a. Because the bonding wire 43a is thicker than the bonding wire 41a, the gap G2 in this case may be larger than the gap G2 of FIG. 3.

The width SL of the individual stress relaxers 84, 85, and 86 (in the X direction) may be, in a plan view, 50% or more of the width WL, which is the connecting point interval of the bonding wire 43a connecting between the circuit pattern 22a1 and the multiple semiconductor chips 31a. The width SL of the individual stress relaxers 84, 85, and 86 (in the X direction) may extend across the space between the second lateral face 72b and the fourth lateral face 72d (that is, the width SL may be equal to the length of the individual first and third lateral faces 72a and 72c). The width SL of the stress relaxers 84, 85, and 86 may preferably be in the range of 80% to 120%, inclusive, of the width WL, which is the connecting point interval of the bonding wire 43a. In addition, the centers of the stress relaxers 84, 85, and 86 preferably individually oppose, in a plan view, the centers of the peaks in the bonding wire 43a. The stress relaxers 84, 85, and 86 need to be thick enough only to maintain the strength allowing them not to be removed from the rear surface of the raised cover member 71a of the cover 71 under impact and stress from outside or the like.

The stress relaxers 84, 85, and 86 need only have overlaps with at least the highest points of the bonding wire 43a in a lateral view seen from the Y direction. In addition, the stress relaxers 84, 85, and 86 may also extend, from the rear surface of the raised cover member 71a of the cover 71 toward the heat dissipation plate 50, up to the height SH measured from the highest points of the peaks in the bonding wire 43a. The height SH be preferably one third of the height WH or greater, and more preferably one half of the height WH or greater. In addition, there may be space below the lower ends of the stress relaxers 84, 85, and 86. Note that the bonding wire 43a includes three peaks, and the leftmost peak of FIG. 6 is located at a lower level than the other two. Therefore, the stress relaxer 86 extends further toward the heat dissipation plate 50 than the other stress relaxers 84 and 85.

The bonding wire 43a is laid in a direction from the second lateral face 72b toward the fourth lateral face 72d. The stress relaxers 84, 85, and 86 may be parallel to the bonding wire 43a, or may be arranged in a direction within the range of ±45° from the direction parallel to the bonding wire 43a. FIG. 5 depicts the case where the stress relaxers 84, 85, and 86 are arranged along (i.e., parallel to) the bonding wire 43a laid in the X direction (i.e., in a direction from the second lateral face 72b toward the fourth lateral face 72d).

Figure 7:
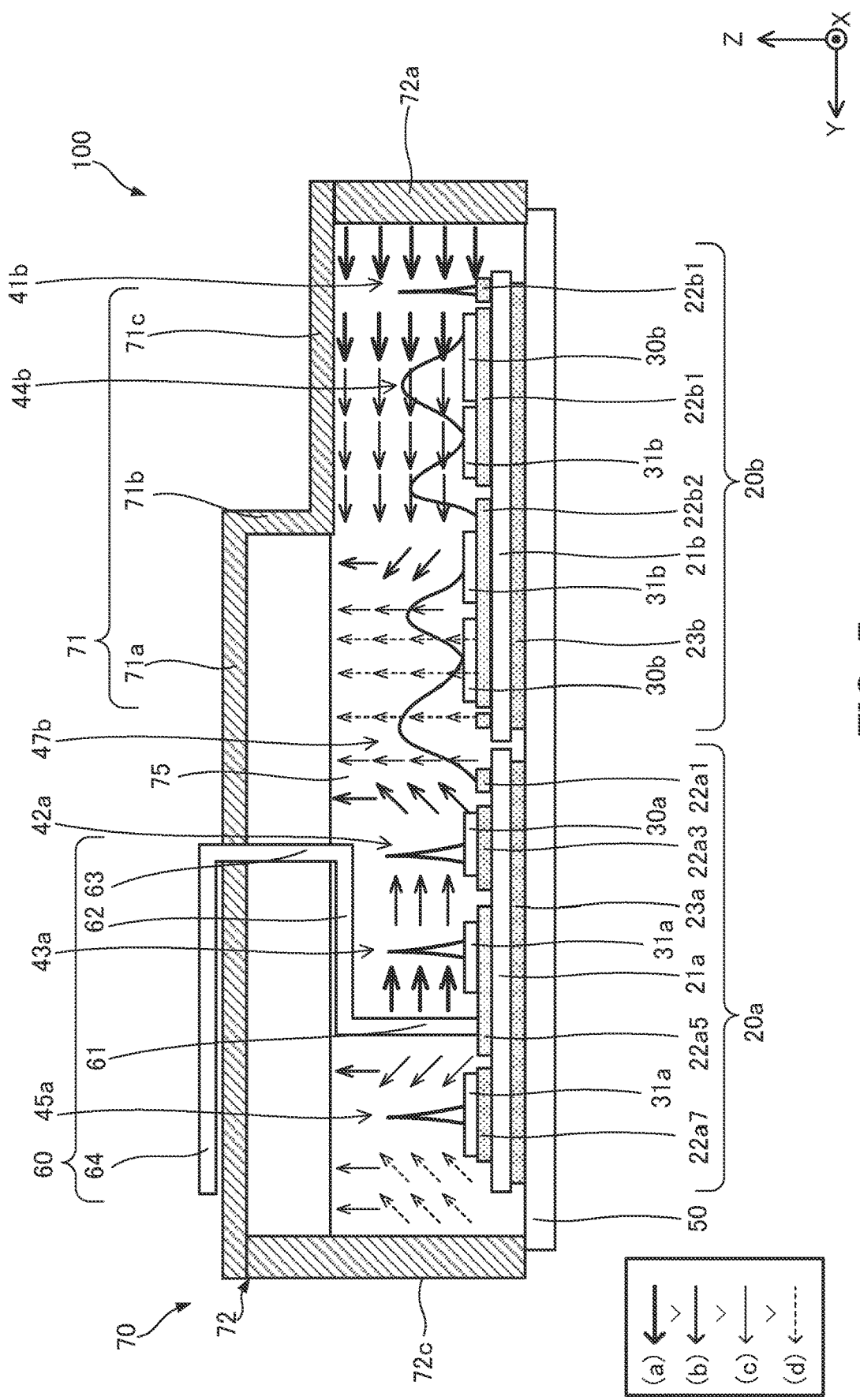
FIG. 7 is a sectional side view of a semiconductor device of a reference example.

Here, a semiconductor device of a reference example is described by way of comparison against the semiconductor device 10, with reference to FIG. 7. FIG. 7 is a sectional side view of the semiconductor device of the reference example. Note that a semiconductor device 100 of FIG. 7 is obtained by removing the stress relaxers 81 to 88 from the semiconductor device 10. Therefore, except for the stress relaxers 81 to 88, the semiconductor device 100 includes like components to those of the semiconductor device 10, which are denoted by like reference numerals. Hence, FIG. 7 provides a comparative cross-sectional view of the semiconductor device 100 corresponding to the cross-sectional view of the semiconductor device 10 along dashed-dotted line X-X of FIG. 2.

FIG. 7 includes four types of arrows ((a) to (d)). These arrows represent the magnitude and direction of changes in the sealing member 75 per unit temperature. The sealing member 75 expands and contracts with heating and cooling. The magnitude of changes due to expansion and contraction of the sealing member 75 is larger in the following order: arrow (a), arrow (b), arrow (c), and arrow (d). The magnitude of changes in the sealing member 75 is larger with a greater volume of the sealing member 75 as well as with a greater change in temperature. Note that FIG. 7 depicts the case where the whole semiconductor device 100 is heated. The directions of the arrows (a) to (d) represent overall directions of expansion in the sealing member 75 due to heating.

There is no diagram of the whole semiconductor device 100 being cooled. Overall directions of contraction in the whole sealing member 75 during cooling are opposite to the directions of all the arrows (a) to (d) represented in FIG. 7. In addition, the magnitude of changes in the sealing member 75 during cooling is the same as in FIG. 7.

In the heated semiconductor device 100 of FIG. 7, the sealing member 75 near the first lateral face 72a greatly expands toward the third lateral face 72c (in the +Y direction). Expansion of the sealing member 75 around this region toward the sunken cover member 71c (in the +Z direction) and the heat dissipation plate 50 (in the −Z direction) and toward the first lateral face 72a (in the −Y direction) is suppressed by the first lateral face 72a and the sunken cover member 71c of the cover 71. As a result, combined with the suppressed expansion, the sealing member 75 expands to an even greater extent toward the second and fourth lateral faces 72b and 72d (in the ±X directions) and toward the third lateral face 72c (in the +Y direction). In addition, near the first lateral face 72a, the semiconductor chips 30b and 31b being heat sources further accelerate expansion of the sealing member 75. The bonding wire 41b encapsulated in the sealing member 75 expanding in this manner is pushed and tilts toward the third lateral face 72c (in the +Y direction).

When the semiconductor device 100 is cooled, on the other hand, the sealing member 75 contracts to a greater degree toward the second and fourth lateral faces 72b and 72d (in the ±X directions) and toward the first lateral face 72a (in the −Y direction). The bonding wire 41b encapsulated in the sealing member 75 contracting in this manner is pushed and tilts toward the first lateral face 72a (in the −Y direction).

Therefore, as the semiconductor device 100 undergoes repeated heating and cooling cycles, the bonding wire 41b swings in the ±Y directions with its bonding points as swing starting points in association with expansion and contraction of the sealing member 75. As a result, the bonding wire 41b may break off near the bonding points due to metal fatigue.

In addition, in the heated semiconductor device 100 of FIG. 7, the sealing member 75 near the first lateral face 72a expands to a greater extent toward the second and fourth lateral faces 72b and 72d (in the ±X directions) and toward the third lateral face 72c (in the +Y direction), as described above. The expansion in the sealing member 75 decreases toward the third lateral face 72c away from the first lateral face 72a. This is because the sealing member 75 closer to the third lateral face 72c is allowed to expand also toward the first lateral face 72a. Expansion (the magnitude of changes) of the sealing member 75 is, therefore, less above the circuit pattern 22b1 of the insulated circuit board 20b than near the first lateral face 72a.

Further, the sealing member 75 located on the third lateral face 72c side (in the +Y direction), corresponding to the raised cover member 71a, is allowed to expand also toward the raised cover member 71a (in the +Z direction). As a result, expansion (the magnitude of changes) of the sealing member 75 decreases further above the circuit pattern 22b2 of the insulated circuit board 20b and the circuit pattern 22a1 of the insulated circuit board 20a.

However, near the bottom portion 61 and the parallel joint portion 62 of the external connecting terminal 60, the sealing member 75 greatly expands toward the first lateral face 72a (in the −Y direction). As for the sealing member 75 around this region, expansion toward the parallel joint portion 62 (in the +Z direction) and the heat dissipation plate 50 (in the −Z direction) and toward the bottom portion 61 (in the +Y direction) is suppressed by the bottom portion 61 and the parallel joint portion 62 of the external connecting terminal 60. As a result, combined with the suppressed expansion, the sealing member 75 expands to a greater extent toward the second and fourth lateral faces 72b and 72d (in the ±X directions) and toward the first lateral face 72a (in the −Y direction). In addition, near the bottom portion 61, the semiconductor chips 31a and 30a being heat sources further accelerate expansion of the sealing member 75. Consequently, combined with the suppressed expansion, the sealing member 75 expands to a greater extent toward the second and fourth lateral faces 72b and 72d (in the ±X directions) and toward the first lateral face 72a (in the −Y direction). The bonding wire 43a encapsulated in the sealing member 75 expanding in this manner are pushed and tilts toward the first lateral face 72a (in the −Y direction). When tilting toward the first lateral face 72a (in the −Y direction), the bonding wire 43a may make contact with the bonding wire 42a depending on its height.

When the semiconductor device 100 is cooled, on the other hand, the sealing member 75 contracts to a greater degree toward the second and fourth lateral faces 72b and 72d (in the ±X directions) and toward the third lateral face 72c (in the +Y direction). The bonding wires 43a and 42a encapsulated in the sealing member 75 contracting in this manner are pushed and tilts toward the third lateral face 72c (in the +Y direction). Especially, when tilting toward the third lateral face 72c (in the +Y direction), the bonding wire 43a may make contact with the external connecting terminals 60 (the bottom portions 61) depending on its height.

Therefore, as the semiconductor device 100 undergoes repeated heating and cooling cycles, the bonding wire 43a swings in the ±Y directions with its bonding points as swing starting points in association with expansion and contraction of the sealing member 75. As a result, the bonding wire 43a may break off near the bonding points due to metal fatigue. Depending on how the bonding wire 43a tilts, it may make contact with the external connecting terminals 60, or the bonding wires 43a and 42a may make contact with each other.

Further, the sealing member 75 located on the third lateral face 72c side (in the +Y direction) relative to the bottom portions 61 of the external connecting terminals 60 is allowed to expand also toward the raised cover member 71a (in the +Z direction). As a result, expansion (the magnitude of changes) of the sealing member 75 further decreases above the circuit pattern 22a7 of the insulated circuit board 20a.

Thus, as the semiconductor device 100 undergoes repeated heating and cooling cycles over long term use, the sealing member 75 is exposed to many cycles of expansion and contraction. As a result, especially the bonding wires 41b and 43a swing in the ±Y directions with their bonding points as swing starting points, and may break off due to metal fatigue at these bonding points.

On the other hand, the semiconductor device 10 includes the stress relaxers 87 and 88 aligned between the bonding wires 41b and 42b and the first lateral face 72a. Therefore, the sealing member 75 located on the first lateral face 72a side relative to the bonding wires 41b and 42b is blocked off by the stress relaxers 87 and 88. Then, the sealing member 75 around the bonding wires 41b and 42b is reduced in volume. When the semiconductor device 10 with the aforementioned configuration undergoes repeated heating and cooling cycles, the magnitude of changes of the sealing member 75 around the bonding wires 41b and 42b (especially, on the first lateral face 72a side) due to cycles of expansion and contraction is lowered. As a result, stress to the bonding wires 41b and 42b associated with changes of the sealing member 75 is reduced, which in turn reduces swinging of the bonding wires 41b and 42, and thus prevents the bonding wires 41b and 42b from not only breaking off but also making contact with their neighboring components. Note that the stress relaxers 81 to 83 are also aligned between the bonding wires 44a to 46a and the third lateral face 72c. As a result, stress to the bonding wires 44a to 46a associated with changes of the sealing member 75 is reduced, which in turn reduces swinging of the bonding wires 44a to 46, and thus prevents the bonding wires 44a to 46 from breaking off.

In addition, especially the bonding wires 41b and 42b swing with their bonding points to the circuit patterns 22b5, 22b6, 22b7, and 22b8 as swing starting points. In particular, the highest points of the peaks in the bonding wires 41b and 42b have large swinging amplitudes. In view of this, in order to suppress swinging of the bonding wires 41b and 42b, the stress relaxers 87 and 88 need to be provided at least between the highest points of the peaks in the bonding wires 41b and 42b and the first lateral face 72a.

The stress relaxers 87 and 88 are designed to deal with changes of the sealing member 75 to the bonding wires 41b and 42b in the ±Y directions only. Therefore, the stress relaxers 87 and 88 need to have X-Z planes, and it is preferable to keep the thickness of the stress relaxers 87 and 88 in the ±Y directions as small as possible. This is because if the stress relaxers 87 and 88 have large thickness in the ±Y directions (for example, in the case where the stress relaxers 87 and 88 are cube-shaped), the magnitude of changes of the sealing member 75 below the stress relaxers 87 and 88 may increase depending on their installation locations, which would in turn exert stress on the bonding wires 41b and 42b.

In addition, the semiconductor device 10 includes the stress relaxers 84 to 86 aligned between the bonding wire 43a and the bottom portions 61 of the external connecting terminals 60. As in the above-described case, the sealing member 75 on the third lateral face 72c side relative to the bonding wire 43a is reduced in volume. As a result, stress to the bonding wire 43a associated with changes of the sealing member 75 is reduced, which in turn reduces swinging of the bonding wire 43a, and thus prevents the bonding wire 43a from not only breaking off but also making contact with its neighboring components.

The foregoing semiconductor device 10 includes the circuit patterns 22b5 and 22b6; the bonding wire 41b configured to connect the front surfaces of the individual circuit patterns 22b5 and 22b6 and recede from the front surfaces; the case 70; and the sealing member 75 filled in the case 70 and encapsulating the bonding wire 41b. The case is rectangle shaped in a plan view, and includes the sidewall 72 made up of the first to fourth lateral faces 72a to 72d sequentially surrounding the housing space 73 in which the circuit patterns 22b5 and 22b6 connected by the bonding wire 41b are placed; and the cover 71 configured to close the opening of the sidewall 72. In this case, in a plan view, the circuit patterns 22b5 and 22b6 are positioned near the first lateral face 72a, the bonding wire 41b is laid in a direction from the second lateral face 72b toward the fourth lateral face 72d, and the stress relaxer 87 is positioned between the bonding wire 41b and the first lateral face 72a. Therefore, the sealing member 75 on the first lateral face 72a side relative to the bonding wire 41b is reduced in volume. When the semiconductor device 10 with the configuration described above undergoes repeated heating and cooling cycles, the magnitude of changes of the sealing member 75 around the bonding wire 41b (especially, on the first lateral face 72a side) due to cycles of expansion and contraction is lowered. As a result, stress to the bonding wire 41b associated with changes of the sealing member 75 is reduced, which in turn reduces swinging of the bonding wire 41b, and thus prevents the bonding wire 41b from not only breaking off and being damaged but also making contact with its neighboring components. Herewith, it is possible to reduce the loss of long-term reliability of the semiconductor device 10.

As has been described above, the stress relaxers 81 to 88 are positioned between the bonding wires 41a to 46a and 41b to 48b and the first and third lateral faces 72a and 72c and the bottom portions 61 of the external connecting terminals 60. Next described is a different layout of stress relaxers.

(b) Modification 1-1

Figure 8:
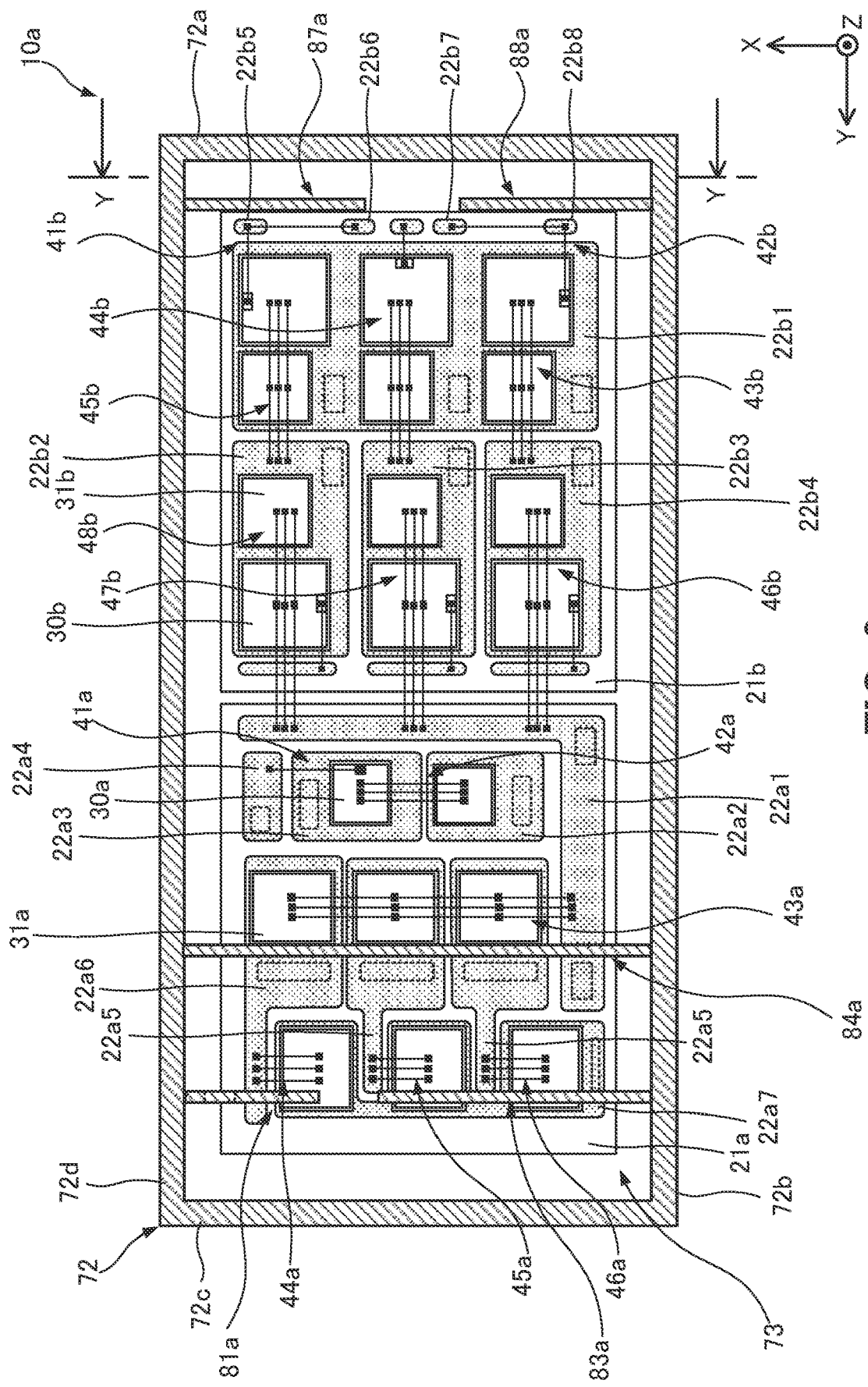
FIG. 8 is a plan view of a semiconductor device according to a modification 1-1 of the first embodiment.
Figure 9:
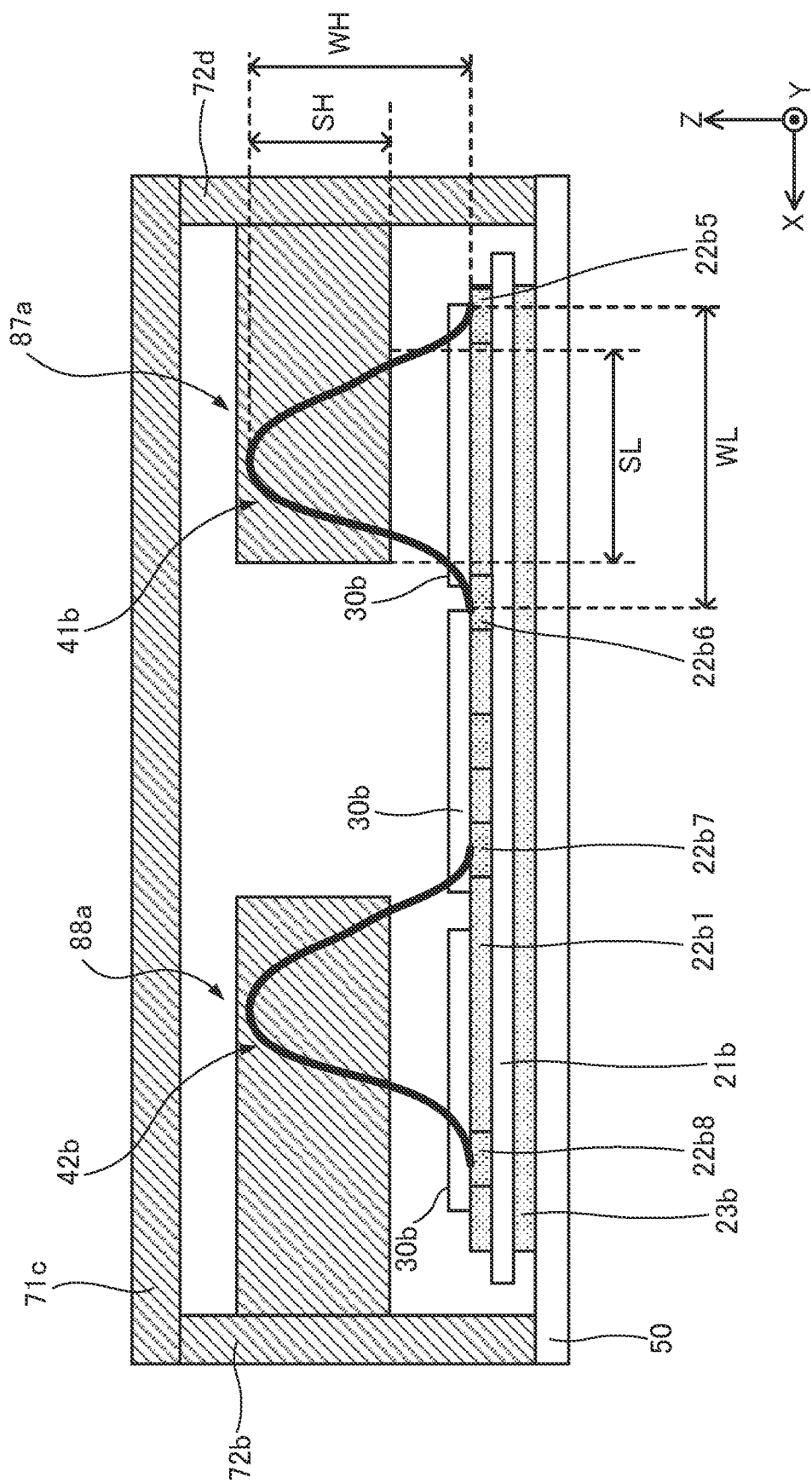
FIG. 9 is a cross-sectional view depicting relevant parts of the semiconductor device according to the modification 1-1 of the first embodiment.

A semiconductor device according to a modification 1-1 is described next with reference to FIGS. 8 and 9. FIG. is a plan view of the semiconductor device of the modification 1-1 according to the first embodiment. FIG. 9 is a cross-sectional view depicting relevant parts of the semiconductor device according to the modification 1-1 of the first embodiment. Note that FIG. 9 is an enlarged cross-sectional view of the semiconductor device along dashed-dotted line Y-Y of FIG. 8. A semiconductor device 10a of the modification 1-1 includes like components to those of the semiconductor device 10, except for the stress relaxers 81 to 88 of FIGS. 1 and 2. The like components are denoted by like reference numerals.

In the semiconductor device 10a, stress relaxers 81a, 83a, 84a, 87a, and 88a are formed on the sidewall 72. The stress relaxers 81a, 83a, 84a, 87a, and 88a are integrally formed with the sidewall 72 and are made of the same material as the sidewall 72. The case 70 of the semiconductor device 10a is built by integrally molding each of the cover 71 including the external connecting terminals 60 and the sidewall 72 with the stress relaxers 81a, 83a, 84a, 87a, and 88a formed thereon, using a thermoplastic resin.

The stress relaxer 87a has a flat plate-like shape. As illustrated in FIG. 8, the stress relaxer 87a extends between the bonding wire 41b and the first lateral face 72a, perpendicularly from the fourth lateral face 72d of the sidewall 72 (i.e., parallel to the first and third lateral faces 72a and 72c) toward the inside of the housing space 73. Note that the stress relaxer 87a is positioned with the gap G2 from the bonding wire 41b, as in the stress relaxer 87 of FIG. 3. In addition, the bonding wire 41b is laid with the gap G1 from the first lateral face 72a, as in FIG. 3.

The stress relaxer 87a may be provided relative to the bonding wire 41b such as to encompass the height SH measured from the highest point in the peak of the bonding wire 41b, as depicted in FIG. 9. The height SH is preferably one third of the height WH or greater, and more preferably one half of the height WH or greater. In addition, there may be space below the lower end of the stress relaxer 87a (on the heat dissipation plate 50 side).

The width SL from the tip end of the stress relaxer 87a (on the second lateral face 72b side) may be in the range of 80% to 120%, inclusive, of the width WL, which is the connecting interval of the bonding wire 41b connecting between the circuit patterns 22b5 and 22b6. Note that the width SL according to the modification 1-1 is approximately symmetrical about the peak of the bonding wire 41b. In addition, the thickness of the stress relaxer 87a is the same as that of the stress relaxer 87.

The stress relaxer 88a also has a flat plate-like shape. As illustrated in FIG. 8, the stress relaxer 88a extends between the bonding wire 42b and the first lateral face 72a, perpendicularly from the second lateral face 72b of the sidewall 72 (i.e., parallel to the first and third lateral faces 72a and 72c) toward the inside of the housing space 73. Note that the stress relaxer 88a is also positioned with the gap G2 from the bonding wire 42b, as in the stress relaxer 88 of FIG. 3. In addition, the bonding wire 42b is laid with the gap G1 from the first lateral face 72a, as in FIG. 3. The height SH and the width SL of the stress relaxer 88a with respect to the bonding wire 42b are the same as those of the stress relaxer 87a with respect to the bonding wire 41b. The stress relaxer 88a also has the same thickness as the stress relaxer 88.

The stress relaxer 84a has a flat plate-like shape. As illustrated in FIG. 8, the stress relaxer 84a is laid parallel to the first and third lateral faces 72a and 72c, connecting between the second and fourth lateral faces 72b and 72d. The stress relaxer 84a is also provided between the bonding wire 43a and the bottom portions 61 of the external connecting terminals 60. Note that the stress relaxer 84a is also positioned with the gap G2 from the bonding wire 43a. In addition, the stress relaxer 84a may also be provided relative to the bonding wire 43a such as to encompass the height SH measured from the highest point in each peak of the bonding wire 43a. The stress relaxer 84a has the same thickness as the individual stress relaxers 84, 85, and 86.

The stress relaxer 81a has a flat plate-like shape. As illustrated in FIG. 8, the stress relaxer 81a extends between the bonding wire 44a and the third lateral face 72c, perpendicularly from the fourth lateral face 72d of the sidewall 72 (i.e., parallel to the first and third lateral faces 72a and 72c) toward the inside of the housing space 73. Note that the stress relaxer 81a is positioned with the gap G2 from the bonding wire 44a, as in the stress relaxer 81 of FIG. 3. In addition, the bonding wire 44a is laid with the gap G1 from the third lateral face 72c, as in FIG. 3. The height SH and the width SL of the stress relaxer 81a with respect to the bonding wire 44a are the same as those of the stress relaxer 87a with respect to the bonding wire 41b. The stress relaxer 81a also has the same thickness as the stress relaxer 81.

The stress relaxer 83a has a flat plate-like shape. As illustrated in FIG. 8, the stress relaxer 83a extends between the bonding wires 45a and 46a and the third lateral face 72c, perpendicularly from the second lateral face 72b of the sidewall 72 (i.e., parallel to the first and third lateral faces 72a and 72c) toward the inside of the housing space 73. Note that the stress relaxer 83a is positioned with the gap G2 from the bonding wires 45a and 46a, as in the stress relaxers 83 and 82 of FIG. 3. In addition, the bonding wires 45a and 46a are laid with the gap G1 from the third lateral face 72c, as in FIG. 3. The height SH and the width SL of the stress relaxer 83a with respect to the bonding wires 45a and 46a are the same as those of the stress relaxer 87a with respect to the bonding wire 41b. The stress relaxer 83a also has the same thickness as the stress relaxers 83 and 82.

Installation of the stress relaxers 81a, 83a, 84a, 87a, and 88a on the sidewall 72 as described above also reduces the volume of the sealing member 75 around the bonding wires 44a, 45a, 46a, 43a, 41b and 42b. When the semiconductor device 10a with the configuration described above undergoes repeated heating and cooling cycles, the magnitude of changes of the sealing member 75 around the bonding wires 44a, 45a, 46a, 43a, 41b and 42b due to cycles of expansion and contraction is lowered. As a result, stress to the bonding wires 44a, 45a, 46a, 43a, 41b and 42b associated with changes of the sealing member 75 is reduced, which in turn reduces swinging of the bonding wires 44a, 45a, 46a, 43a, 41b and 42b, and thus prevents the bonding wires 44a, 45a, 46a, 43a, 41b and 42b from not only breaking off and being damaged but also making contact with their neighboring components. Herewith, it is possible to reduce the loss of long-term reliability of the semiconductor device 10a.

Note that among the stress relaxers included in the semiconductor devices 10 and 10a, some may be installed on the cover 71 while others may be installed on the sidewall 72, as appropriate.

(c) Second Embodiment

Figure 10:
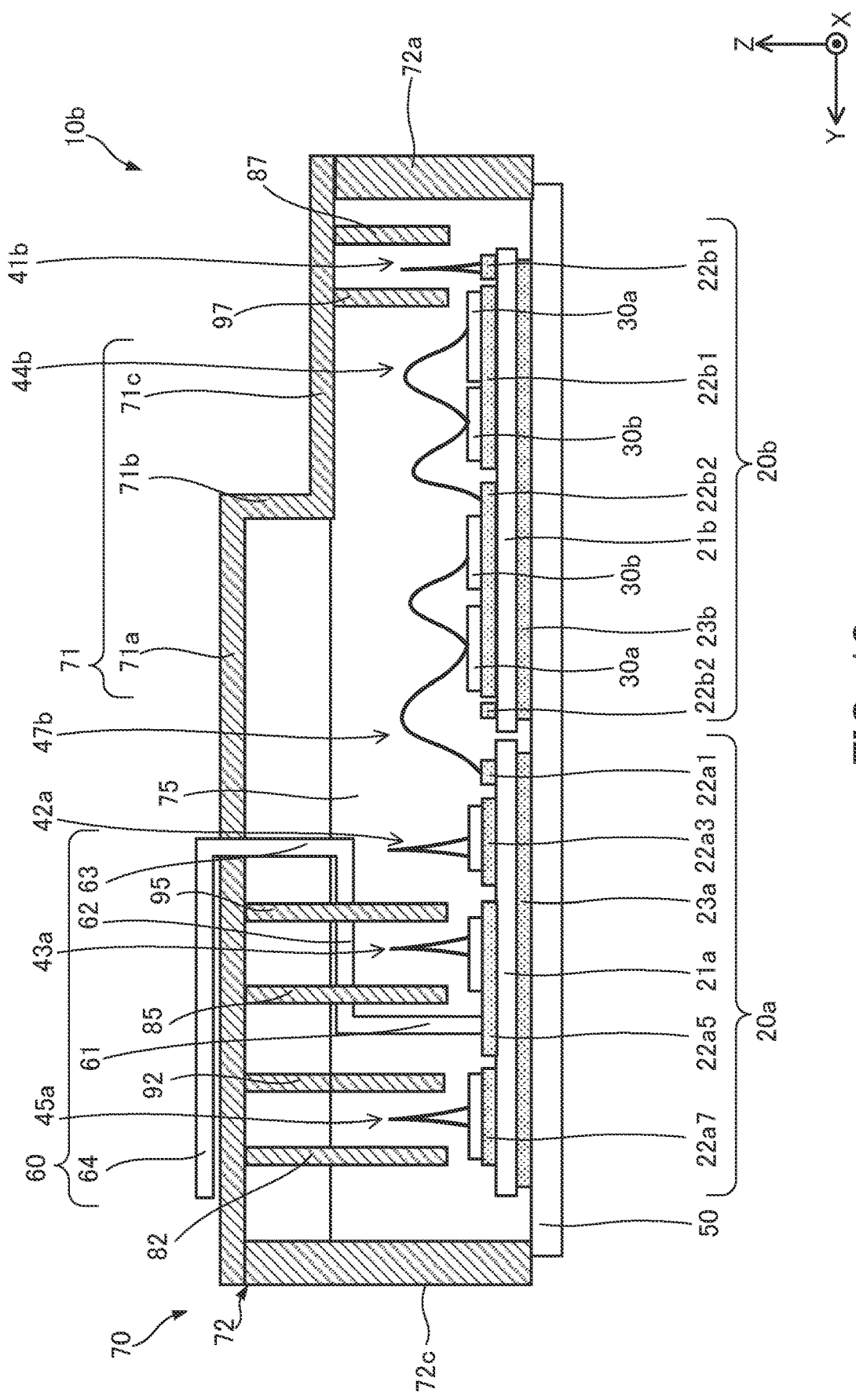
FIG. 10 is a sectional side view of a semiconductor device according to a second embodiment.

A semiconductor device according to a second embodiment is different from the semiconductor devices 10 and 10a of the first embodiment in that yet another stress relaxer is provided across a bonding wire from each stress relaxer. Such a semiconductor device is described next with reference to FIG. 10. FIG. 10 is a sectional side view of the semiconductor device according to the second embodiment. FIG. 10 corresponds to the cross-sectional view of the semiconductor device 10 of FIG. 1. For a plan view of a semiconductor device 10b of FIG. 10, FIG. 2 is used as a reference. The semiconductor device 10b of FIG. 10 is formed by adding more stress relaxers to the semiconductor device 10 of FIGS. 1 and 2. For example, a stress relaxer 97 is formed, on the rear surface of the sunken cover member 71c, across the bonding wire 41b from the stress relaxer 87. The stress relaxer 97 is in the same size as the stress relaxer 87, and faces the stress relaxer 87 across the bonding wire 41b.

As described above in relation to the semiconductor device 100 of FIG. 7, the magnitude of changes of the sealing member 75 is significant near the first lateral face 72a, and the bonding wire 41b is subjected to stress caused by expansion and contraction of the sealing member 75. According to the first embodiment, installation of the stress relaxer 87 between the bonding wire 41b and the first lateral face 72a reduces the volume of the sealing member 75 on the first lateral face 72a side relative to the bonding wire 41b. Herewith, the magnitude of changes of the sealing member 75 is reduced. According to the second embodiment, the stress relaxer 97 is additionally installed on the opposite side from the stress relaxer 87 across the bonding wire 41b. This reduces the volume of the sealing member 75 on the opposite side to the first lateral face 72a relative to the bonding wire 41b, which in turn reduces the magnitude of changes of the sealing member 75 on the opposite side to the first lateral face 72a. Therefore, it is possible to reduce stress caused by volume changes of the sealing member 75 on both sides of the bonding wire 41b, i.e., on the first lateral face 72a side and the opposite side of the bonding wire 41b from the first lateral face 72a. As a result, the semiconductor device 10b of the second embodiment provides even more reliable prevention of damage to the bonding wire 41b compared with the semiconductor device 10 of the first embodiment.

Similarly, stress relaxers 95 and 92 are individually formed on the rear surface of the raised cover member 71a across the bonding wires 43a and 45a from the stress relaxers 85 and 82, respectively. The stress relaxers 95 and 92 are in the same size as the stress relaxers 85 and 82, and face the stress relaxers 85 and 82 across the bonding wires 43a and 45a, respectively.

In addition, although no illustration is given here, a stress relaxer is similarly provided for each of the stress relaxers 81, 83, 84, 86, and 88 such as to oppose the corresponding stress relaxer. According to the second embodiment described above, the stress relaxers are formed on the cover 71; however, this is merely an example and the stress relaxers may be formed on the sidewall 72, as in the modification 1-1, or on at least either one of the cover 71 and the sidewall 72.

According to one aspect, it is possible to prevent damage to the bonding wires over long-term use, thereby reducing the loss of long-term reliability of the semiconductor device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
a first conductive part having a first front surface, and a second conductive part having a second front surface and being separated from the first conductive part;
a first bonding wire having one and the other ends, the one end being connected to the first front surface of the first conductive part and the one end being connected to the second front surface of the second conductive part, the first bonding wire having a non-flat portion between the one and the other ends so that a portion between the one and the other ends is away from the first front surface and the second front surface;
a case having a housing space therein that accommodates the first conductive part and the second conductive part, and including
a sidewall having a first lateral face, a second lateral face, a third lateral face, and a fourth lateral face, sequentially surrounding the housing space to form a rectangular shape in a plan view of the semiconductor device, and
a cover disposed on the sidewall to cover the housing space;
a sealing member filling the case to seal the first bonding wire; and
a first stress relaxer, wherein:
the first conductive part and the second conductive part are positioned closer to the first lateral face than are the other lateral faces in the plan view,
the first bonding wire extends from the second lateral face toward the fourth lateral face, and
the first stress relaxer is positioned between the first bonding wire and the first lateral face.

2. The semiconductor device according to claim 1, wherein the first bonding wire extends in a direction parallel to the first lateral face of the case and is disposed so as to have a first gap between the first bonding wire and the first lateral face.

3. The semiconductor device according to claim 2, wherein the first gap is in a range of 100% to 1000% of a height measured from the first front surface of the first conductive part to a highest point of the first bonding wire in a vertical direction orthogonal to the first front surface of the first conductive part.

4. The semiconductor device according to claim 1, wherein the first stress relaxer extends in a direction parallel to a direction in which the first bonding wire extends in the plan view and has a second gap between the first bonding wire and the first stress relaxer.

5. The semiconductor device according to claim 4, wherein the second gap is in a range of 10% to 300% of a height measured from the first front surface of the first conductive part to a highest point of the first bonding wire in a vertical direction orthogonal to the first front surface of the first conductive part.

6. The semiconductor device according to claim 1, wherein the first stress relaxer having an area that overlaps, in a lateral view that is a view in a direction parallel to the first front surface of the first conductive part and orthogonal to the first lateral face of the case, at least a highest point of the first bonding wire as measured from the first front surface of the first conductive part in a vertical direction orthogonal to the first front surface.

7. The semiconductor device according to claim 6, wherein in the lateral view, in the vertical direction, an overlap length between the first stress relaxer and the first bonding wire is one third or more of a height of the first bonding wire as measured from the first front surface of the first conductive part.

8. The semiconductor device according to claim 1, wherein
the cover has a lower surface facing the housing space, and
the first stress relaxer extends from the lower surface of the cover toward the first front surface of the first conductive part.

9. The semiconductor device according to claim 1, wherein the first stress relaxer extends in a width direction from the second lateral face toward the fourth lateral face of the case, and
a length of the first stress relaxer in the width direction is 50% or more of a length between the one end and the other end of the first bonding wire.

10. The semiconductor device according to claim 1, wherein the first stress relaxer extends from at least one of the second lateral face or the fourth lateral face of the case, toward the other.

11. The semiconductor device according to claim 1, further comprising a second stress relaxer additionally provided across the first bonding wire from the first stress relaxer.

12. The semiconductor device according to claim 11, wherein the second stress relaxer is positioned across a highest point of the first bonding wire as measured from the first stress relaxer.

13. The semiconductor device according to claim 12, wherein
the second stress relaxer has an area that overlaps, in a lateral view that is a view in a direction parallel to the first front surface of the first conductive part and orthogonal to the first lateral face of the case, at least a highest point of the first bonding wire as measured from the first front surface of the first conductive part in a vertical direction orthogonal to the first front surface of the first conductive part, and
in the lateral view, in the vertical direction, an overlap length between the first stress relaxer and the first bonding wire is one third or more of a height of the first bonding wire as measured from the first front surface of the first conductive part.

14. The semiconductor device according to claim 11, wherein
the cover having a lower surface facing the housing space, and
the second stress relaxer extends from the lower surface of the cover toward the first front surface of the first conductive part.

15. The semiconductor device according to claim 11, wherein
the second stress relaxer extends in a width direction from the second lateral face toward the fourth lateral face of the case, and
a length of the second stress relaxer in the width direction is 50% or more of a length between the one end and the other end of the first bonding wire.

16. The semiconductor device according to claim 11, wherein the second stress relaxer extends from one to the other of the second lateral face and the fourth lateral face of the case.

17. The semiconductor device according to claim 1, further comprising a semiconductor chip disposed across the first bonding wire from the first lateral face of the case in the plan view.

18. The semiconductor device according to claim 1, wherein the sealing member fills the case up to a level of the cover, sealing the first bonding wire therein.

19. The semiconductor device according to claim 1, further comprising:
- a third conductive part having a third front surface, and a fourth conductive part having a fourth front surface and being separated from the third conductive part, the third conductive part and the fourth conductive part being arranged in a direction from the second lateral face toward the fourth lateral face of the case in the housing space;
- a second bonding wire having one and the other ends, the one end being connected to the third front surface of the third conductive part and the other end being connected to the fourth front surface of the fourth conductive part, and the second bonding wire having a non-flat portion between the one and the other ends so that a portion of the second bonding wire between the one and the other ends is away from the third front surface and the fourth front surface, the second bonding wire being sealed with the sealing member; and
- an external connecting terminal being in a plate-like form, have a principal surface facing the first lateral face of the case, and including
  - a bottom portion extending in a vertical direction orthogonal to the third front surface,
  - a parallel joint portion extending parallel to the third front surface from an end of the bottom portion, and
  - an external connecting portion electrically connected to an end of the parallel joint portion, wherein:
- the external connecting terminal includes a plurality of external connecting terminals,
- each of the third conductive part and the fourth conductive part is disposed, in the plan view, at a side of the bottom portion of one of the external connecting terminals,
- the parallel joint portion of each of the external connecting terminals is positioned further away from the third front surface than is the second bonding wire, and
- the semiconductor device further comprises a second stress relaxer positioned between the second bonding wire and the bottom portion.

20. The semiconductor device according to claim 19, wherein the sealing member fills the case up to a level of the parallel joint portion of each of the external connecting terminals, sealing the second bonding wire therein.

* * * * *